US009786390B2

(12) United States Patent
Kim

(10) Patent No.: US 9,786,390 B2
(45) Date of Patent: *Oct. 10, 2017

(54) MEMORY DEVICE REPAIRABLE BY SOFT AND HARD REPAIR OPERATIONS AND MEMORY SYSTEM INCLUDING THE SAME

(71) Applicant: SK hynix Inc., Gyeonggi-do (KR)

(72) Inventor: Kwi-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 314 days.

This patent is subject to a terminal disclaimer.

(21) Appl. No.: 14/567,561

(22) Filed: Dec. 11, 2014

(65) Prior Publication Data

US 2016/0035438 A1   Feb. 4, 2016

(30) Foreign Application Priority Data

Jul. 30, 2014   (KR) ........................ 10-2014-0097252

(51) Int. Cl.
*G11C 29/00* (2006.01)
*G11C 17/16* (2006.01)
*G11C 29/44* (2006.01)

(52) U.S. Cl.
CPC .......... *G11C 29/78* (2013.01); *G11C 29/4401* (2013.01); *G11C 17/16* (2013.01); *G11C 2029/4402* (2013.01)

(58) Field of Classification Search
None
See application file for complete search history.

(56) References Cited

U.S. PATENT DOCUMENTS

| 6,667,902 | B2 | 12/2003 | Peng | |
| 6,777,757 | B2 | 8/2004 | Peng et al. | |
| 6,940,751 | B2 | 9/2005 | Peng et al. | |
| 7,173,851 | B1 | 2/2007 | Callahan et al. | |
| 7,269,047 | B1 | 9/2007 | Fong et al. | |
| 8,423,839 | B2* | 4/2013 | Yoel | G11C 29/24 365/200 |
| 8,885,424 | B2* | 11/2014 | Jeong | G11C 7/20 365/189.12 |
| 8,887,012 | B2* | 11/2014 | Kwan | G11C 29/4401 714/723 |
| 9,087,613 | B2* | 7/2015 | Sohn | G06F 11/27 |
| 9,362,008 | B2* | 6/2016 | Yang | G11C 29/78 |
| 9,437,330 | B2* | 9/2016 | Park | G11C 29/78 |
| 2008/0091988 | A1* | 4/2008 | Yoel | G11C 29/24 714/711 |
| 2015/0303948 | A1* | 10/2015 | Yoon | G11C 29/52 714/764 |

* cited by examiner

*Primary Examiner* — Justin R Knapp
(74) *Attorney, Agent, or Firm* — IP & T Group LLP

(57) ABSTRACT

A memory device includes a non-volatile memory circuit suitable for storing system hard repair data, a temporary memory circuit suitable for storing system soft repair data, a system register circuit suitable for receiving and storing the system hard repair data or the system soft repair data during a boot-up operation, and a memory bank suitable for performing a repair operation based on first data stored in the system register circuit.

18 Claims, 4 Drawing Sheets

MEMORY DEVICE REPAIRABLE BY SOFT AND HARD REPAIR OPERATIONS AND MEMORY SYSTEM INCLUDING THE SAME

CROSS-REFERENCE TO RELATED APPLICATIONS

The present application claims priority of Korean Patent Application No. 10-2014-0097252, filed on Jul. 30, 2014, which is incorporated herein by reference in its entirety.

BACKGROUND

1. Field

Exemplary embodiments of the present invention relate to a memory device and a memory system including the memory device and, more particularly, to a repair operation of a memory device and a memory system including the memory device.

2. Description of the Related Art

FIG. 1 is a block view illustrating a repair operation in a general memory device, e.g., a Dynamic Random Access Memory (DRAM) device.

A memory device may include a plurality of memory banks, an example of which is shown in FIG. 1. Referring to FIG. 1, the memory device includes a memory array 110 provided with a plurality of memory cells, a row circuit 120 for activating a word line that is selected based on a row address R_ADD, and a column circuit 130 for accessing (which means reading or writing) the data of a bit line that is selected based on a column address C_ADD.

A row fuse circuit 140 stores a repair row address REPAIR_R_ADD for a row address corresponding to a defective memory cell among the memory cells of the memory array 110. A row comparator 150 compares the repair row address REPAIR_R_ADD stored in the row fuse circuit 140 with the row address R_ADD inputted from outside of the memory device. When the repair row address REPAIR_R_ADD is the same as the row address R_ADD, the row comparator 150 performs a control on the row circuit 120 to activate a redundancy word line instead of a word line designated based on the row address R_ADD. In short, a row (which is a word line) corresponding to the repair row address REPAIR_R_ADD stored in the row fuse circuit 140 is replaced by a redundancy row (which is a redundancy word line).

A signal RACT shown in FIG. 1 is enabled in response to an active command for activating a word line in the memory array 110, and the signal RACT is disabled in response to a precharge command for deactivating a word line. Also, 'IRD' represents a read command, while 'IWR' is a write command.

The row fuse circuit 140 generally uses a laser fuse. A laser fuse stores data of a logic high level or a logic low level depending on whether the laser fuse is cut. The laser fuse may be programmed in wafer stage, but once the semiconductor wafer is put in a semiconductor package, the laser fuse cannot be programmed. Also, it is difficult to design the laser fuse below a given size due to technical limitations in decreasing its pitch length.

To alleviate such issues, as disclosed in U.S. Pat. Nos. 6,940,751, 6,777,757, 6,667,902, 7,173,851, and 7,269,047, a memory device may include a non-volatile memory such as an e-fuse array circuit, a NAND flash memory, a NOR flash memory, a Magnetoresistive Random Access Memory (MRAM), a Spin Transfer Torque Magnetoresistive Random Access Memory (STT-MRAM), a Resistive Random Access Memory (ReRAM), a Phase-Change Random Access Memory (PC RAM) and the like, and store repair data, e.g., a repair address, in the non-volatile memory.

FIG. 2 is a block view illustrating a non-volatile memory circuit used for storing repair data in the memory device.

Referring to FIG. 2, the memory device includes a plurality of memory banks BK0 to BK3, registers 210_0 to 210_3, and a non-volatile memory circuit 201. The registers 210_0 to 210_3 are provided for the memory banks BK0 to BK3, respectively, to store repair data.

The non-volatile memory circuit 201 substitutes the row fuse circuit 140 shown in FIG. 1. The non-volatile memory circuit 201 stores repair data, for example, repair addresses, for the memory banks BK0 to BK3. The non-volatile memory circuit 201 may be one of non-volatile memories such as an e-fuse array circuit, a NAND flash memory, a NOR flash memory, a Magnetoresistive Random Access Memory (MRAM), a Spin Transfer Torque Magnetoresistive Random Access Memory (STT-MRAM), a Resistive Random Access Memory (ReRAM), a Phase-Change Random Access Memory (PC RAM) and the like.

The registers 210_0 to 210_3 provided for the memory banks BK0 to BK3, respectively, store repair data of the corresponding memory bank. For example, the register 210_0 stores repair data of the memory bank BK0, and the register 210_2 stores repair data of the memory bank BK2. The registers 210_0 to 210_3 are formed of latch circuits, and they may store the repair data as long as power is supplied thereto. The repair data to be stored in the registers 210_0 to 210_3 are transmitted from the non-volatile memory circuit 201.

The repair data stored in the non-volatile memory circuit 201 are not directly used but moved into and stored in the registers 210_0 to 210_3 to be used. This is because the non-volatile memory circuit 201 is in an array, and it takes time to call the data stored in the array. In short, it is impossible to instantly read the data from the non-volatile memory circuit 201. This is the reason that repair operations may not be performed using data stored in the non-volatile memory circuit 201. Therefore, a boot-up operation, where the repair data stored in the non-volatile memory circuit 201 are transmitted to and stored in the registers 210_0 to 210_3, is performed. After the boot-up operation, a repair operation is performed using the data stored in the registers 210_0 to 210_3.

When the row fuse circuit 140 is substituted with the non-volatile memory circuit 201 and the registers 210_0 to 210_3, it is also possible to repair memory device defects detected after the wafer stage. Researchers and industry are further developing technology that can repair memory device defects that are detected after the fabrication of the memory device is completed and/or after the product containing the memory device is sold by accessing the non-volatile memory circuit 201.

SUMMARY

An embodiment of the present invention is directed to multiple techniques for selectively repairing memory devices permanently or temporarily.

In accordance with an embodiment of the present invention, a memory device includes a non-volatile memory circuit suitable for storing system hard repair data, a temporary memory circuit suitable for storing system soft repair data, a system register circuit suitable for receiving and storing the system hard repair data or the system soft repair data during a boot-up operation, and a memory bank suitable for performing a repair operation based on a first data stored in the system register circuit.

The memory device may further include a memory register circuit suitable for receiving and storing a memory hard repair data during the boot-up operation, and the non-volatile memory circuit may store the memory hard repair data, and transmit the memory hard repair data to the memory register during the boot-up operation, and the memory bank may perform the repair operation based on the first data stored in the system register circuit and a second data stored in the memory register circuit.

The memory hard repair data may be programmed to be stored in the non-volatile memory circuit while the memory device is fabricated.

The system hard repair data and the system soft repair data may be transmitted from a memory controller to the memory device to be stored in non-volatile memory circuit and the temporary memory circuit.

The system hard repair data and the memory hard repair data may be retained permanently in the non-volatile memory circuit, and the system soft repair data, the first data, and the second data may be erased from the temporary memory circuit, the memory register circuit, and the system register circuit when the memory device is powered off.

The non-volatile memory circuit may include one-time programmable memory cells in which data are unchangeable (permanent) once the data are programmed.

In accordance with another embodiment of the present invention, a memory device includes a non-volatile memory circuit including first to $N^{th}$ memory regions for storing memory hard repair data of first to $N^{th}$ memory banks and first to $N^{th}$ system regions for storing system hard repair data of first to $N^{th}$ memory banks, a temporary memory circuit including first to $N^{th}$ temporary regions for storing system soft repair data of the first to $N^{th}$ memory banks, first to $N^{th}$ memory register circuits suitable for receiving and storing the memory hard repair data stored in the first to $N^{th}$ memory regions during a boot-up operation, first to $Nu^{th}$ system register circuits suitable for receiving and storing the system hard repair data stored in the first to $N^{th}$ system regions or the system soft repair data stored in the first to $N^{th}$ temporary regions during the boot-up operation, and the first to $N^{th}$ memory banks suitable for performing a repair operation based on first data stored in the first to $N^{th}$ memory register circuits and second data stored in the first to $N^{th}$ system register circuits, wherein the N is an integer greater than 1.

The memory hard repair data of the first to $N^{th}$ memory banks may be programmed to be stored in the first to $N^{th}$ memory regions while the memory device is fabricated.

The system hard repair data of the first to $N^{th}$ memory banks and the system soft repair data of the first to $N^{th}$ memory banks may be transmitted from a memory controller to the memory device to be stored in the first to $N^{th}$ system regions and the first to $N^{th}$ temporary regions.

When a bank address and a normal address are applied to the memory device together with a system hard repair command, the normal address may be programmed in a system region that is selected based on the bank address among the first to $N^{th}$ system regions.

When a bank address and a normal address are applied to the memory device together with a system soft repair command, the normal address may be programmed in a temporary region that is selected based on the bank address among the first to $N^{th}$ temporary regions.

When the system soft repair command is applied when the memory device is powered up, the system soft repair data stored in the first to $N^{th}$ temporary regions may be transmitted to the first to $N^{th}$ system register circuits during the boot-up operation, and when the system soft repair command is not applied when the memory device is powered up, the system hard repair data stored in the first to $N^{th}$ system regions may be transmitted to the first to $N^{th}$ system register circuits during the boot-up operation.

The non-volatile memory circuit may include one-time programmable memory cells in which data are unchangeable once the data are programmed.

In accordance with yet another embodiment of the present invention, a memory system includes a memory device suitable for performing a system hard repair operation in response to a hard repair command, and performing a system soft repair operation in response to a soft repair command, and a memory controller suitable for applying a first repair address data for the system hard repair operation to the memory device together with the hard repair command, and applying a second repair address data for the system soft repair operation to the memory device together with the soft repair command.

The memory controller may verify whether the memory device is repaired through the system soft repair operation, and then permanently repair the memory device through the system hard repair operation.

The memory device may include a non-volatile memory circuit including first to $N^{th}$ memory regions for storing memory hard repair data of first to $N^{th}$ memory banks and first to $N^{th}$ system regions for storing system hard repair data of first to $N^{th}$ memory banks, a temporary memory circuit including first to $N^{th}$ temporary regions for storing system soft repair data of the first to $N^{th}$ memory banks, first to $N^{th}$ memory register circuits suitable for receiving and storing the memory hard repair data that are stored in the first to $N^{th}$ memory regions during a boot-up operation, first to $N^{th}$ system register circuits suitable for receiving and storing the system hard repair data that are stored in the first to $N^{th}$ system regions or the system soft repair data stored in the first to $N^{th}$ temporary regions during the boot-up operation, and the first to $N^{th}$ memory banks suitable for performing a repair operation based on first data stored in the first to $N^{th}$ memory register circuits and second data stored in the first to $N^{th}$ system register circuits, wherein the N is an integer greater than 1.

The memory hard repair data of the first to $N^{th}$ memory banks may be programmed in the first to $N^{th}$ memory regions while the memory device is fabricated.

The first repair address may include a bank address and a normal address, and the normal address may be programmed in a system region that is selected based on the bank address among the first to $N^{th}$ system regions, when the bank address and the normal address are applied to the memory device together with the system hard repair command.

The second repair address may include a bank address and a normal address, and the normal address may be programmed in a temporary region that is selected based on the bank address among the first to $N^{th}$ temporary regions, when the bank address and the normal address are applied to the memory device together with the system soft repair command.

When the system soft repair command is applied when the memory device is powered up, the system soft repair data stored in the first to $N^{th}$ temporary regions may be transmitted to the first to $N^{th}$ system register circuits during the boot-up operation, and when the system soft repair command is not applied when the memory device is powered up, the system hard repair data stored in the first to $N^{th}$ system regions may be transmitted to the first to $N^{th}$ system register circuits during the boot-up operation.

The non-volatile memory circuit may include one-time programmable memory cells in which data are unchangeable once the data are programmed.

DETAILED DESCRIPTION

Figure 1:
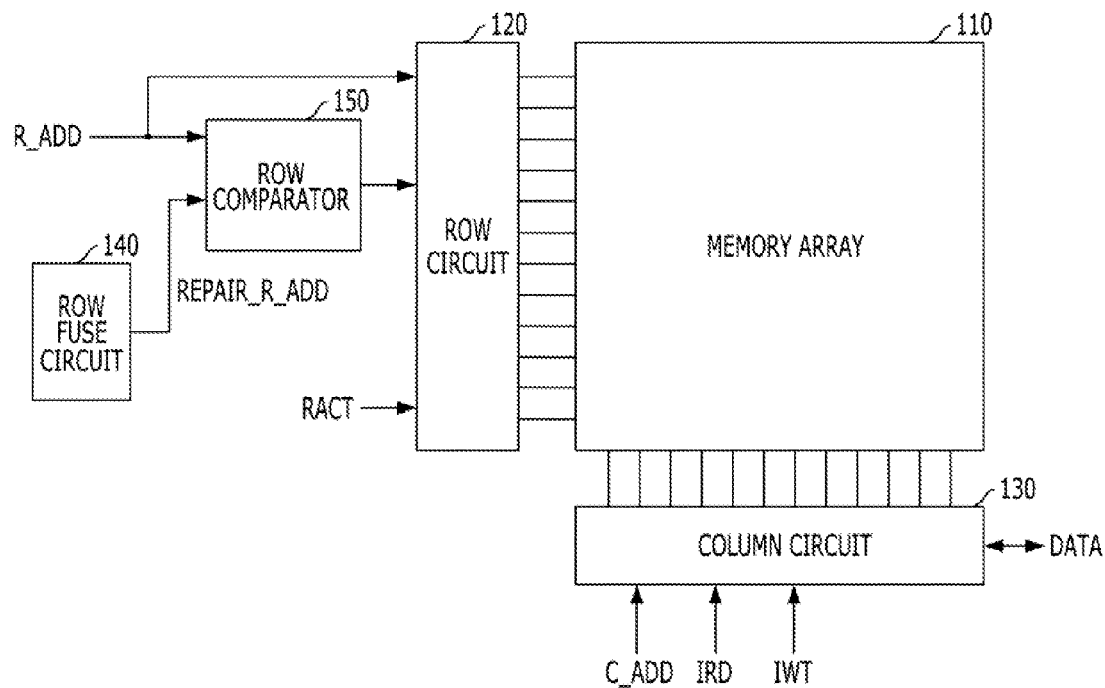
FIG. 1 is a block view illustrating a repair operation in a general memory device, e.g., a Dynamic Random Access Memory (DRAM) device.
Figure 2:
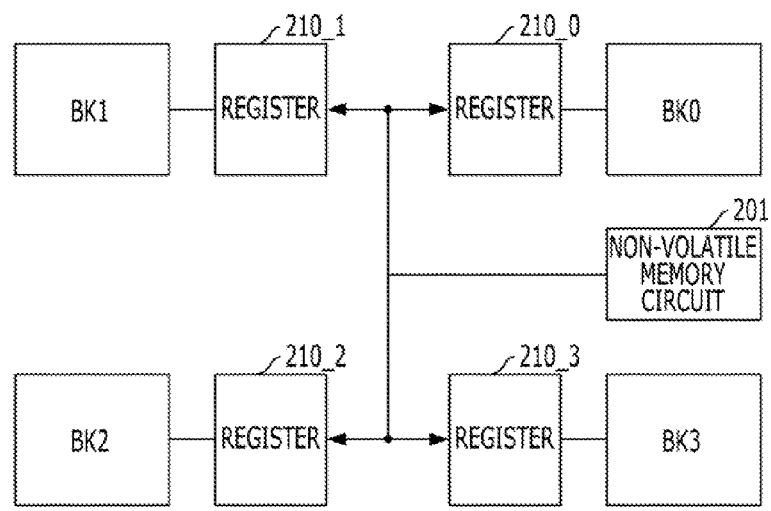
FIG. 2 is a block view illustrating a non-volatile memory circuit used for storing repair data in the memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Hereafter, the meanings of a memory hard repair, a system hard repair, and a system soft repair are as follows.

(A) Memory hard repair: "Memory" of the memory hard repair signifies a repair performed by the manufacturer of a memory device. "Hard" signifies a permanent repair whose repair effect is maintained although power is not supplied to the memory device. Therefore, memory hard repair means a permanent repair that is performed by the manufacturer of the memory device in the middle of fabricating the memory device.

(B) System hard repair: "System" of the system hard repair signifies a repair performed while a memory device is mounted on a system using the memory device (in other words, after the memory device is packaged). In short, system repair may be performed based on the signals that are transmitted from a memory controller to the memory device while the memory device is mounted on the system after the fabrication of the memory device. The meaning of "hard" is the same as that of the memory hard repair. Therefore, system hard repair means a permanent repair that is performed while the memory device is mounted on the system after the fabrication of the memory device.

(C) System soft repair: The meaning of "system" is the same as that of the system hard repair. "Soft" signifies a repair whose repair effect disappears when the power is not supplied to the memory device. Since the effect of the soft repair is maintained while power is supplied to the memory device, the effect of the previous soft repair is lost when the memory device is re-initialized (that is, when the power supply to the memory device is cut off and then resumed).

Figure 3:
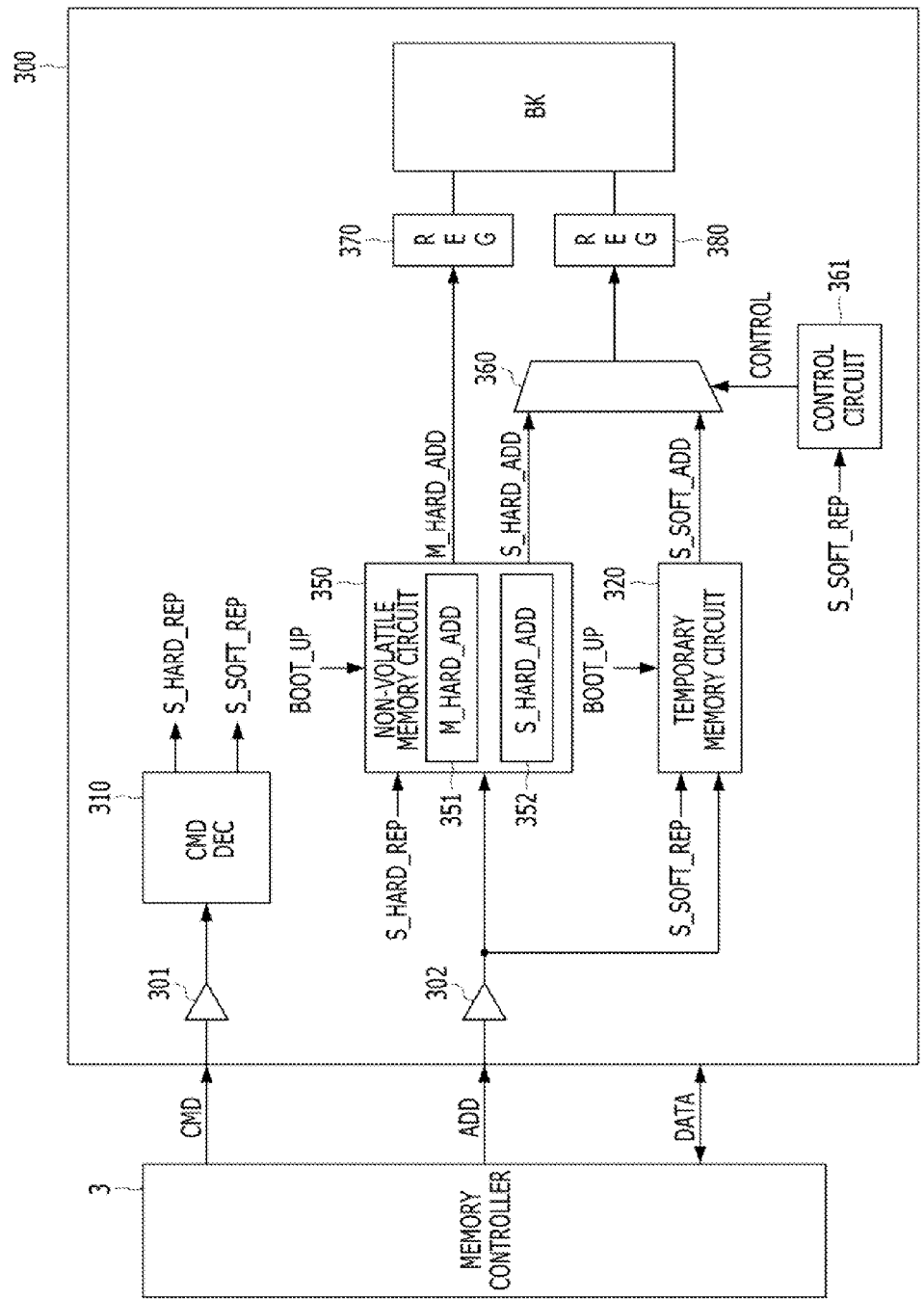
FIG. 3 is a block view illustrating a memory device 300 in accordance with an embodiment of the present invention.

FIG. 3 is a block view illustrating a memory device 300 in accordance with an embodiment of the present invention. In FIG. 3, a simplified form of the memory device 300 is described in accordance with an embodiment of the present invention. For a simple description, a memory controller 3 for supplying a command CMD and an address ADD to the memory device 300, and transmitting or receiving a data DATA to or from the memory device 300 is illustrated together.

Referring to FIG. 3, the memory device 300 may include a command receiver 301, an address receiver 302, a command decoder 310, a temporary memory circuit 320, a non-volatile memory circuit 350, a selector 360, a control circuit 361, a memory register circuit 370, a system register circuit 380, and a memory bank BK. The memory device 300 includes constituent structures for receiving a data DATA from the memory controller 3 and providing the memory bank BK with the data DATA as write data, and includes constituent structures for transmitting read data that is read out of the memory bank BK to the memory controller 3 as data DATA. Since these constituent structures are not directly related to the technology of the present invention, they are omitted in the drawing.

The command receiver 301 may receive a command CMD inputted from outside of the memory device 300. The command CMD may include a plurality of signals, such as a Chip Selection signal CS, an active signal ACT, a Row Address Strobe signal RAS, a Column Address Strobe signal CAS, and a Write Enable signal WE.

The address receiver 302 may receive an address ADD, which is a multi-bit signal inputted from outside of the memory device 300. The address ADD may include a row address and a column address. The row address and the column address may be inputted through the same pad. An address ADD inputted in synchronization with a row address strobe signal RAS may be recognized as a row address in the memory device, and an address ADD inputted in synchronization with a column address strobe signal CAS may be recognized as a column address in the memory device 300.

The command decoder 310 may decode the command CMD received through the command receiver 301 and generate such internal commands as a system hard repair command S_HARD_REP and a system soft repair command S_SOFT_REP. The command decoder 310 may enable the system hard repair command S_HARD_REP when a combination of signals that constitute the command CMD corresponds to the system hard repair command S_HARD_REP, and enable the system soft repair command S_SOFT_REP when the combination of the signals corresponds to the system soft repair command S_SOFT_REP. The command decoder 310 may receive not only the command CMD but also parts of the address ADD and use them for the decoding operation, and it may use a combination of the commands CMD, inputted not for one cycle but for a plurality of cycles, for the decoding operation as well. Additionally, the command decoder 310 may generate other internal commands, such as an active command, a precharge command, a read command, a write command, a refresh command and so forth. However, since these internal commands are not directly related to the technology of the present invention, they are not shown in the drawing.

The temporary memory circuit 320 may be a circuit for temporarily storing system soft repair data S_SOFT_ADD. The temporary memory circuit 320 may receive and temporarily store system soft repair information, that is, a repair address that represents a memory cell required to be repaired in the memory bank BK, in response to the enabling of the system soft repair command S_SOFT_REP. The system soft repair information may be transmitted from outside of the memory device 300 in the form of an address ADD. The system soft repair data S_SOFT_ADD stored in the temporary memory circuit 320 may be transmitted to the selector 360 when a boot-up signal BOOT_UP is enabled. The temporary memory circuit 320 may include a plurality of latches. The data stored in the temporary memory circuit 320 may be retained as long as power is supplied to the memory device 300.

The non-volatile memory circuit 350 may include a first region 351 for storing memory hard repair data M_HARD_ADD and a second region 352 for storing system hard repair data S_HARD_ADD. When the system hard repair command S_HARD_REP is enabled, the non-volatile memory circuit 350 receives system hard repair data information, that is, a repair address representing a memory cell that needs to be repaired in the memory bank BK, and program it as the system hard repair data S_HARD_ADD in the second region 352. The system hard repair information may be transmitted from outside of the memory device 300 in the form of an address ADD. The memory hard repair data M_HARD_ADD may be programmed in the first region 351 of the non-volatile memory circuit 350 by the manufacturer of the memory device during the fabrication process of the memory device 300. When a boot-up signal BOOT_UP is enabled, the memory hard repair data M_HARD_ADD and the system hard repair data S_HARD_ADD that are stored in the non-volatile memory circuit 350 may be outputted. The non-volatile memory circuit 350 may be a non-volatile memory of diverse kinds such as an e-fuse array circuit, a NAND flash memory, a NOR flash memory, a Magnetoresistive Random Access Memory (MRAM), a Spin Transfer Torque Magnetoresistive Random Access Memory (STT-MRAM), a Resistive Random Access Memory (ReRAM), a Phase-Change Random Access Memory (PC-RAM) and the like. Generally, an e-fuse array circuit is used as the non-volatile memory circuit 350. The e-fuse array circuit includes a plurality of e-fuses that are arranged in an array, and the e-fuses are used as memory cells. However, since it is impossible to program the e-fuses again after the e-fuses are initially programmed, the e-fuses are called one-time programmable memory cells.

The selector 360 may select one between the system soft repair data S_SOFT_ADD and the system hard repair data S_HARD_ADD outputted from the temporary memory circuit 320 and the non-volatile memory circuit 350 during a boot-up operation and output the selected repair data to the system register circuit 380. The selector 360 selects the system soft repair data S_SOFT_ADD while a control signal CONTROL is enabled. While a control signal CONTROL is disabled, the selector 360 selects the system hard repair data S_HARD_ADD. The control circuit 361 generates the control signal CONTROL. When the system soft repair command S_SOFT_REP has been enabled more than once since the power was supplied to the memory device 300, the control circuit 361 enables the control signal CONTROL, and when the system soft repair command S_SOFT_REP has not been enabled even once since supplying the power to the memory device 300, the control circuit 361 disables the control signal CONTROL.

The memory register circuit 370 may receive and store the memory hard repair data M_HARD_ADD stored in the first region 351 of the non-volatile memory circuit 350 during a boot-up operation. The system register circuit 380 may receive and store the repair data selected by the selector 360 during a boot-up operation. Therefore, when the system soft repair command S_SOFT_REP has been enabled before, the system register circuit 380 may receive and store the system soft repair data S_SOFT_ADD. When the system soft repair command S_SOFT_REP has not been enabled before, the system register circuit 380 may receive and store the system hard repair data S_HARD_ADD.

The memory bank BK may substitute a defective cell with a redundancy cell by using the repair data stored in the memory register circuit 370 and the system register circuit 380. To be specific, the memory cells corresponding to the addresses stored in the memory register circuit 370 and the memory cells corresponding to the addresses stored in the system register circuit 380 in the memory bank BK may be replaced with redundancy memory cells. Meanwhile, the memory bank BK may perform an operation commanded by the memory controller 3, such as an active operation, a precharge operation, a read operation, a write operation, and a refresh operation.

The boot-up operation in which repair data is transmitted from the non-volatile memory circuit 350 and/or the temporary memory circuit 320 to the memory register circuit 370 and the system register circuit 380 is performed in response to the enabling of a boot-up signal BOOT_UP. The boot-up signal BOOT_UP may be automatically enabled in the memory device 300 after the memory device 300 is powered up. For example, the boot-up signal BOOT_UP may be automatically enabled a predetermined time after the memory device 300 is powered up. The boot-up signal BOOT_UP may be enabled by a command CMD from the memory controller 3.

Figure 4:
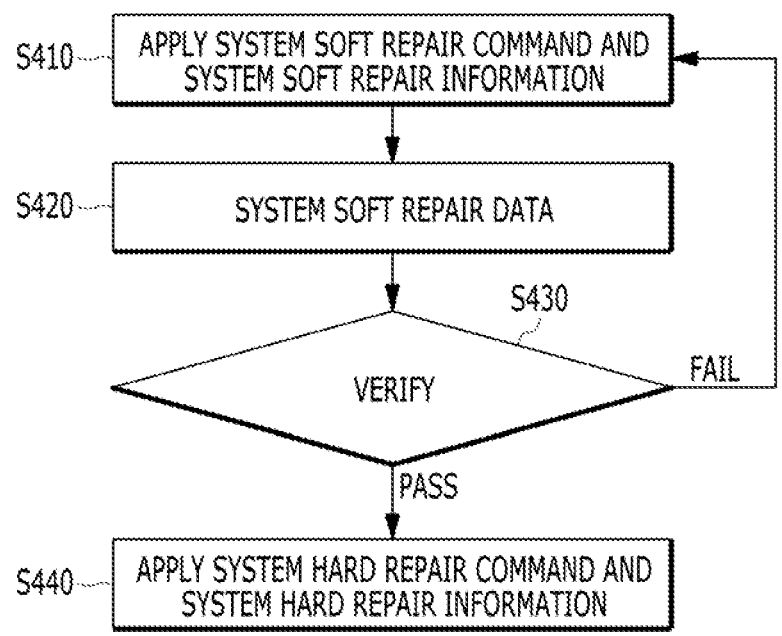
FIG. 4 is a flowchart describing an operation of a memory controller 3 and the memory device 300 that are shown in FIG. 3.

FIG. 4 is a flowchart describing an operation of the memory controller 3 and the memory device 300 that are shown in FIG. 3. Hereafter, how the system soft repair and the system hard repair are used is described with reference to FIG. 4.

Referring to FIG. 4, in step S410, a system soft repair command S_SOFT_REP and system soft repair information corresponding to the system soft repair command S_SOFT_REP are applied from the memory controller 3 to the memory device 300. The system soft repair command S_SOFT_REP may be applied through the command CMD, and the system soft repair information may be applied through the address ADD. The system soft repair information transmitted from the memory controller 3 to the memory device 300 may be stored as system soft repair data in the temporary memory circuit 320 of the memory device 300.

In step S420, a boot-up operation may be performed in the memory device 300. The boot-up operation may be performed as the memory controller 3 directs the memory device 300 to perform the boot-up operation. The direction for performing the boot-up operation may be given in diverse ways, which include a command CMD, an address ADD, and data DATA. Through the boot-up operation, the memory hard repair data M_HARD_ADD stored in the first region 351 of the non-volatile memory circuit 350 is transmitted to and stored in the memory register circuit 370, and the system soft repair data S_SOFT_ADD stored in the temporary memory circuit 320 is transmitted to and stored in the system register circuit 380. In this way, the memory cells corresponding to the memory hard repair data M_HAR- D_ADD and the system soft repair data S_SOFT_ADD are replaced with the redundancy cells in the memory bank BK.

In step S430, it is verified whether the memory device 300 is properly repaired. This may be carried out as the memory controller 3 directs the memory device 300 to perform a write operation and/or a read operation and verifies the operation performance result. When the verification result turns out to be 'pass', the logic flow goes to step S440. When the verification result turns out to be 'fail', the steps S410 and S420 may be performed again. The steps S410 and S420 being performed again signifies that the previous repair operation failed. Thus, when the steps S410 and S420 are performed again, the soft repair data S_SOFT_ADD may be changed.

When the verification result turns out to be 'pass' in step S430, it means that the system soft repair data S_SOFT_ADD is correct. Therefore, in the step S440, which is performed when the verification result turns out to be 'pass' in the step S430, system hard repair data that is the same as the system soft repair data S_SOFT_ADD may be programmed in the non-volatile memory circuit 350 of the memory device 300. This may be performed by applying a system hard repair command S_HARD_REP and system hard repair information corresponding thereto from the memory controller 3 to the memory device 300. The system hard repair command S_HARD_REP may be applied through the command CMD, and the system hard repair information may be applied through the address ADD. The system hard repair information applied in the form of the address ADD may be programmed as the system hard repair data in the non-volatile memory circuit 350 of the memory device 300.

When the process of step S430 is completed, the memory device 300 may be repaired permanently. Since the memory hard repair data M_HARD_ADD and the system soft repair data S_SOFT_ADD stored in the non-volatile memory circuit 350 are retained although the memory device 300 is powered up again, the defective memory cells of the memory bank BK may be replaced with redundancy memory cells by simply performing the boot-up operation.

Referring to FIG. 4, it is possible to check whether the repair is performed correctly by performing a system soft repair operation before the permanent system hard repair operation is performed. In short, it is advantageous in that whether the repair is performed correctly may be verified through the system soft repair operation before the irrevocable and permanent system hard repair operation.

Although an example of verifying the repair through the system soft repair operation before the system hard repair operation is performed is described with reference to FIG. 4, the system soft repair operation is not always used for this purpose, and the system soft repair operation may be used independently from the system hard repair operation. For example, the system soft repair operation may be used for a repair operation which is not related to the purpose of the system hard repair operation, and a memory device may be designed to perform the system soft repair operation without the system hard repair operation.

Figure 5:
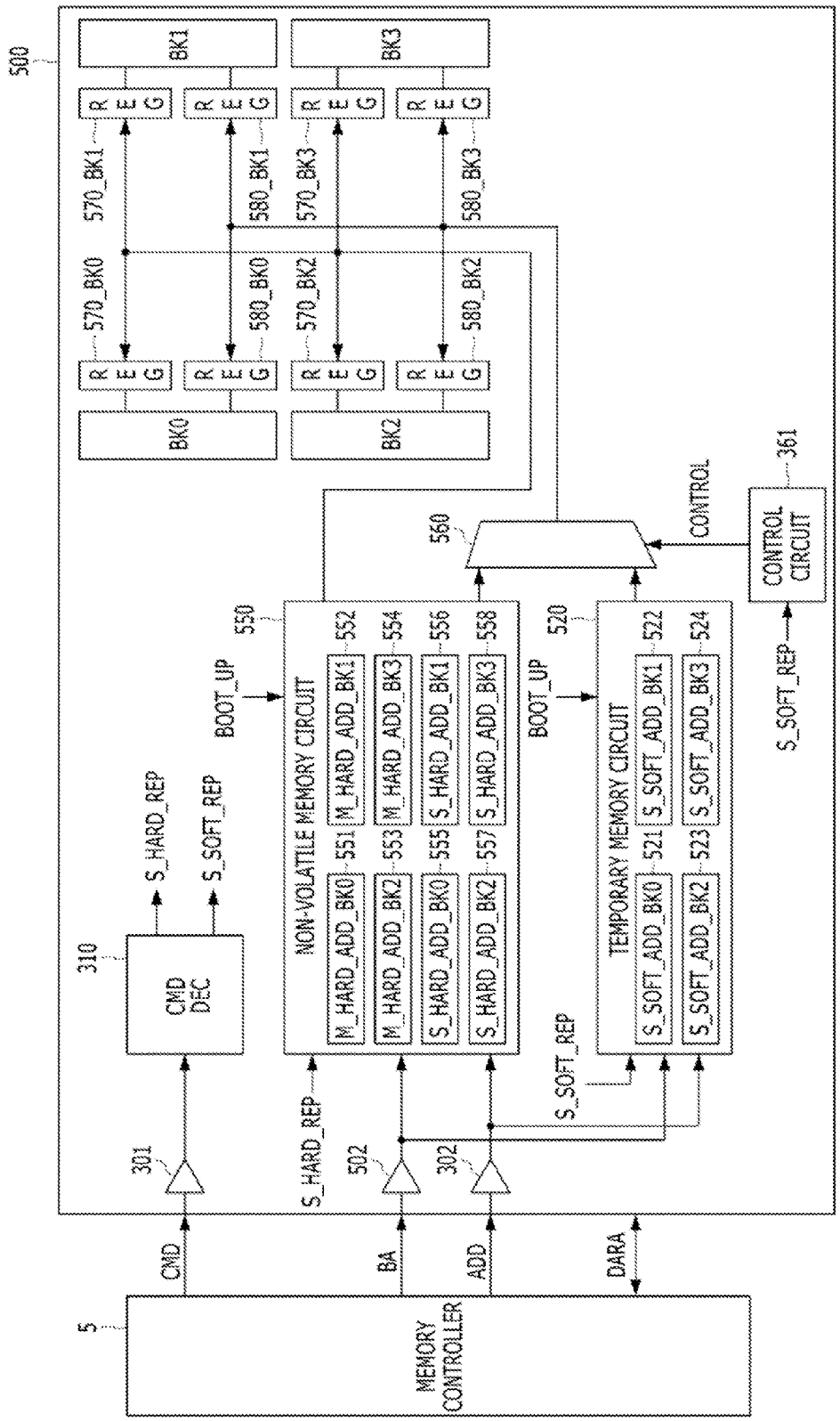
FIG. 5 is a block view illustrating a memory device 500 in accordance with another embodiment of the present invention.

FIG. 5 is a block view illustrating a memory device 500 in accordance with another embodiment of the present invention. The memory device 500 includes a plurality of memory banks BK0 to BK3, and how a repair operation is performed in the memory device 500 is described with reference to FIG. 5. For a simple description, a memory controller 5 for supplying a command CMD, a bank address BA, and a normal address ADD (which is generally called 'an address ADD', but referred to as 'a normal address ADD', herein, to be distinguished from the bank address BA) to the memory device 500, and transmitting or receiving a data DATA to or from the memory device 500 is illustrated together.

Referring to FIG. 5, the memory device 500 may include a command receiver 301, a bank address receiver 502, an address receiver 302, a command decoder 310, a temporary memory circuit 520, a non-volatile memory circuit 550, a selector 560, a control circuit 361, memory register circuits 570_BK0 to 570_BK3, system register circuits 580_BK0 to 580_BK3, and memory banks BK0 to BK3. The memory device 500 includes constituent structures for receiving data DATA from the memory controller 5 and providing the memory banks BK0 to BK3 with the data DATA as write data, and includes constituent structures for transmitting read data that is read out of the memory banks BK0 to BK3 to the memory controller 5 as data DATA. Since these constituent structures are not directly related to the technology of the present invention, they are omitted in the drawing.

The bank address receiver 502 may receive a bank address BA, which is a multi-bit signal inputted from outside of the memory device 500. The bank address BA may be an address for selecting a memory bank to be accessed among the memory banks BK0 to BK3. Since the normal address ADD is an address for selecting a memory cell to be accessed among the memory cells of the memory bank selected based on the bank address BA, the bank address BA may be regarded as an upper-level address rather than the normal address ADD. The bank address BA may be simultaneously inputted together with the normal address ADD.

The temporary memory circuit 520 may include temporary regions 521 to 524. The temporary regions 521 to 524 may correspond one-to-one to the memory banks BK0 to BK3, respectively. The temporary regions 521 to 524 may store system soft repair data S_SOFT_ADD_BK0 to S_SOFT_ADD_BK3 of the memory banks BK0 to BK3. When a system soft repair command S_SOFT_REP is applied from the memory controller 5 to the memory device 500, the bank address BA and the normal address ADD may be applied together. When the system soft repair command S_SOFT_REP is enabled, the normal address ADD (which is the system soft repair data) may be stored in the temporary region that is selected based on the bank address BA among the temporary regions 521 to 524. In other words, the bank address BA is used to select one temporary region among the temporary regions 521 to 524 when the system soft repair command S_SOFT_REP is enabled, and the normal address ADD may be temporarily stored in the selected temporary region. The system soft repair data S_SOFT_ADD_BK0 to S_SOFT_ADD_BK3 stored in the temporary regions 521 to 524 of the temporary memory circuit 520 may be transmitted to the selector 560 when a boot-up signal BOOT_UP is enabled.

The non-volatile memory circuit 550 may include memory regions 551 to 554 and system regions 555 to 558. The memory regions 551 to 554 correspond one-to-one to the memory banks BK0 to BK3, and the system regions 555 to 558 may also correspond one-on-one to the memory banks BK0 to BK3. The memory regions 551 to 554 may be the regions for storing memory hard repair data M_HARD_ADD_BK0 to M_HARD_ADD_BK3 of the memory banks BK0 to BK3. The memory hard repair data M_HARD_ADD_BK0 to M_HARD_ADD_BK3 may be programmed in the memory regions 551 to 554 by the manufacturer when the memory device 500 is fabricated.

The system regions 555 to 558 of the non-volatile memory circuit 550 may be the regions for storing system hard repair data S_HARD_ADD_BK0 to S_HARD_ADD_BK3 of the memory banks BK0 to BK3. The bank address BA and the normal address ADD may be applied together when a system hard repair command S_HARD_REP is applied from the memory controller 5 to the memory device 500. When the system soft repair command S_SOFT_REP is enabled, the non-volatile memory circuit 550 may program the normal address ADD (which is the system hard repair data S_HARD_ADD_BK0 to S_HARD_ADD_BK3) in the system region that is selected based on the bank address BA among the system regions 555 to 558. In other words, when the system regions 555 to 558 are programmed based on the system hard repair command S_HARD_REP, the bank address BA is used to select one system region among the system regions 555 to 558, and the normal address ADD may be programmed in the selected system region. When the boot-up signal BOOT_UP is enabled, the memory hard repair data M_HARD_ADD_BK0 to M_HARD_ADD_BK3 stored in the memory regions 551 to 554 of the non-volatile memory circuit 550 may be transmitted to the memory register circuits 570_BK0 to 570_BK3, and the system hard repair data S_HARD_ADD_BK0 to S_HARD_ADD_BK3 stored in the system regions 555 to 558 of the non-volatile memory circuit 550 may be transmitted to the selector 560.

The selector 560 may select the system soft repair data S_SOFT_ADD_BK0 to S_SOFT_ADD_BK3 that are outputted from the temporary regions 521 to 524 of the temporary memory circuit 520 while a control signal CONTROL is enabled and, while a control signal CONTROL is disabled, the selector 560 may select the system hard repair data S_HARD_ADD_BK0 to S_HARD_ADD_BK3 that are outputted from the system regions 555 to 558 of the non-volatile memory circuit 550.

The memory register circuits 570_BK0 to 570_BK3 may receive and store the memory hard repair data M_HARD_ADD_BK0 to M_HARD_ADD_BK3 stored in the memory regions 551 to 554 of the non-volatile memory circuit 550 during a boot-up operation. The first memory register circuit 570_BK0 may receive and store the first memory hard repair data M_HARD_ADD_BK0 stored in the first memory region 551, and the second memory register circuit 570_BK1 may receive and store the second memory hard repair data M_HARD_ADD_BK1 stored in the second memory region 552. Likewise, the other memory register circuits 570_BK2 and 570_BK3 may receive and store the memory hard repair data M_HARD_ADD_BK2 and M_HARD_ADD_BK3 stored in the corresponding memory regions 553 and 554.

The system register circuits 580_BK0 to 580_BK3 may receive and store the repair data selected by the selector 560 during a boot-up operation. The first system register circuit 580_BK0 may receive and store the first system soft repair data S_SOFT_ADD_BK0 stored in the first temporary region 521 or the first system hard repair data S_HARD_ADD_BK0 stored in the first system region 555, and the second system register circuit 580_BK1 may receive and store the second system soft repair data S_SOFT_ADD_BK1 stored in the second temporary region 522 or the second system hard repair data S_HARD_ADD_BK1 stored in the second system region 556. Likewise, the other system register circuits 580_BK2 and 580_BK3 may receive and store the system soft repair data S_SOFT_ADD_BK2 and S_SOFT_ADD_BK3 or the system hard repair data S_HARD_ADD_BK2 and S_HARD_ADD_BK3.

The memory banks BK0 to BK3 may replace defective memory cells with redundancy cells based on the repair data stored in the memory register circuits corresponding thereto among the memory register circuits 570_BK0 to 570_BK3 and the system register circuits corresponding thereto among the system register circuits 580_BK0 to 580_BK3. FIG. 5 illustrates a case where the number of the memory banks BK0 to BK3 is '4', and thus the number of the temporary regions 521 to 524, the number of the memory regions 551 to 554, the number of the system regions 555 to 558, the number of the memory register circuits 570_BK0 to 570_BK3, and the number of the system register circuits 580_BK0 to 580_BK3 are all '4'. However, it should be obvious to those skilled in the art that the number of memory banks may be any arbitrary integer equal to or greater than '1'.

The memory device 500 of FIG. 5 includes a plurality of the memory banks BK0 to BK3, but the memory device 500 may operate using the same method as the memory device 300 of FIG. 3. Therefore, the operation of the memory device 500 may be omitted herein.

According to the embodiments of the present invention, a memory device may be repaired permanently or non-permanently (temporarily) using various methods. The memory device may be repaired selectively in permanent or non-permanent ways.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
a non-volatile memory circuit suitable for storing system hard repair data;
a temporary memory circuit suitable for storing system soft repair data;
a system register circuit suitable for receiving and storing the system hard repair data or the system soft repair data during a boot-up operation;
a memory bank suitable for performing a repair operation based on first data stored in the system register circuit; and
a memory register circuit suitable for receiving and storing memory hard repair data during the boot-up operation,
wherein the non-volatile memory circuit stores the memory hard repair data, and transmits the memory hard repair data to the memory register during the boot-up operation, and
wherein the memory bank performs the repair operation based on the first data stored in the system register circuit and second data stored in the memory register circuit.

2. The memory device of claim 1, wherein the memory hard repair data is programmed to be stored in the non-volatile memory circuit while the memory device is fabricated.

3. The memory device of claim 2, wherein the system hard repair data and the system soft repair data are transmitted from a memory controller to the memory device to be stored in the non-volatile memory circuit and the temporary memory circuit.

4. The memory device of claim 1, wherein the system hard repair data and the memory hard repair data are retained permanently in the non-volatile memory circuit, and
the system soft repair data, the first data, and the second data are erased from the temporary memory circuit, the memory register circuit, and the system register circuit when the memory device is powered off.

5. The memory device of claim 1, wherein the non-volatile memory circuit includes one-time programmable memory cells in which data is permanently programmed.

6. A memory device, comprising:
a non-volatile memory circuit including first to $N^{th}$ memory regions for storing memory hard repair data of first to $N^{th}$ memory banks and first to $N^{th}$ system regions for storing system hard repair data of first to $N^{th}$ memory banks;
a temporary memory circuit including first to $N^{th}$ temporary regions for storing system soft repair data of the first to $N^{th}$ memory banks;
first to $N^{th}$ memory register circuits suitable for receiving and storing the memory hard repair data stored in the first to $N^{th}$ memory regions during a boot-up operation;
first to $N^{th}$ system register circuits suitable for receiving and storing the system hard repair data stored in the first to $N^{th}$ system regions or the system soft repair data stored in the first to $N^{th}$ temporary regions during the boot-up operation; and
the first to $N^{th}$ memory banks suitable for performing a repair operation based on first data stored in the first to $N^{th}$ memory register circuits and second data stored in the first to $N^{th}$ system register circuits,
wherein the N is an integer greater than 1.

7. The memory device of claim 6, wherein the memory hard repair data of the first to $N^{th}$ memory banks are programmed to be stored in the first to $N^{th}$ memory regions while the memory device is fabricated.

8. The memory device of claim 7, wherein the system hard repair data of the first to $N^{th}$ memory banks and the system soft repair data of the first to $N^{th}$ memory banks are transmitted from a memory controller to the memory device to be stored in the first to $N^{th}$ system regions and the first to $N^{th}$ temporary regions.

9. The memory device of claim 6, wherein when a bank address and a normal address are applied to the memory device together with a system hard repair command, the normal address is programmed in a system region that is selected based on the bank address among the first to $N^{th}$ system regions.

10. The memory device of claim 6, wherein when a bank address and a normal address are applied to the memory device together with a system soft repair command, the normal address is programmed in a temporary region that is selected based on the bank address among the first to $N^{th}$ temporary regions.

11. The memory device of claim 10, wherein when the system soft repair command is applied since the memory device is powered up, the system soft repair data stored in the first to $N^{th}$ temporary regions are transmitted to the first to $N^{th}$ system register circuits during the boot-up operation, and
when the system soft repair command is not applied since the memory device is powered up, the system hard repair data stored in the first to $N^{th}$ system regions are transmitted to the first to $N^{th}$ system register circuits during the boot-up operation.

12. The memory device of claim 6, wherein the non-volatile memory circuit includes one-time programmable memory cells in which data is permanently programmed.

13. A memory system, comprising:
a memory device suitable for performing a system hard repair operation in response to a hard repair command, and performing a system soft repair operation in response to a soft repair command; and
a memory controller suitable for applying first repair address data for the system hard repair operation to the memory device together with the hard repair command, and applying second repair address data for the system soft repair operation to the memory device, together with the soft repair command,
wherein the memory device comprises:
a non-volatile memory circuit including first to $N^{th}$ memory regions for storing memory hard repair data of first to $N^{th}$ memory banks and first to $N^{th}$ system regions for storing system hard repair data of first to $N^{th}$ memory banks;
a temporary memory circuit including first to $N^{th}$ temporary regions for storing system soft repair data of the first to $N^{th}$ memory banks;
first to $N^{th}$ memory register circuits suitable for receiving and storing the memory hard repair data that are stored in the first to $N^{th}$ memory regions during a boot-up operation;
first to $N^{th}$ system register circuits suitable for receiving and storing the system hard repair data that are stored in the first to $N^{th}$ system regions or the system soft repair data stored in the first to $N^{th}$ temporary regions during the boot-up operation; and
the first to $N^{th}$ memory banks suitable for performing a repair operation based on first data stored in the first to $N^{th}$ memory register circuits and second data stored in the first to $N^{th}$ system register circuits,
wherein the N is an integer greater than 1.

14. The memory system of claim 13, wherein the memory controller verifies whether the memory device is repaired through the system soft repair operation, and then permanently repairs the memory device through the system hard repair operation.

15. The memory system of claim 13, wherein the memory hard repair data of the first to $N^{th}$ memory banks are programmed to be stored in the first to $N^{th}$ memory regions while the memory device is fabricated.

16. The memory system of claim 13, wherein the first repair address includes a bank address and a normal address, and the normal address is programmed in a system region that is selected based on the bank address among the first to $N^{th}$ system regions, when the bank address and the normal address are applied to the memory device together with the system hard repair command.

17. The memory system of claim 13, wherein the second repair address includes a bank address and a normal address, and the normal address is programmed in a temporary region that is selected based on the bank address among the first to $N^{th}$ temporary regions, when the bank address and the normal address are applied to the memory device together with the system soft repair command.

18. The memory system of claim 13, wherein when the system soft repair command is applied since the memory device is powered up, the system soft repair data stored in the first to $N^{th}$ temporary regions are transmitted to the first to $N^{th}$ system register circuits during the boot-up operation, and
when the system soft repair command is not applied since the memory device is powered up, the system hard repair data stored in the first to $N^{th}$ system regions are transmitted to the first to $N^{th}$ system register circuits during the boot-up operation.

* * * * *